US008564115B2

(12) United States Patent
Chan et al.

(10) Patent No.: US 8,564,115 B2
(45) Date of Patent: Oct. 22, 2013

(54) PACKAGE STRUCTURE HAVING MICRO-ELECTROMECHANICAL ELEMENT

(75) Inventors: Chang-Yueh Chan, Taichung (TW); Chien-Ping Huang, Taichung (TW); Chun-Chi Ke, Taichung (TW); Chun-An Huang, Taichung (TW); Chih-Ming Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/492,220

(22) Filed: Jun. 8, 2012

(65) Prior Publication Data

US 2012/0241937 A1 Sep. 27, 2012

Related U.S. Application Data

(62) Division of application No. 12/769,041, filed on Apr. 28, 2010, now Pat. No. 8,198,689.

(30) Foreign Application Priority Data

Dec. 28, 2009 (TW) ................................ 98145250 A

(51) Int. Cl.
  *H01L 23/04* (2006.01)
(52) U.S. Cl.
  USPC ........... 257/693; 257/415; 257/733; 257/737; 257/738; 257/E29.324; 257/E23.069; 438/51
(58) Field of Classification Search
  USPC ......... 257/415, 418, 687, 693, 704, 733, 737, 257/738, E29.324, E23.068, E23.069, 257/E23.141; 438/51
  See application file for complete search history.

(56) References Cited

U.S. PATENT DOCUMENTS

| | | | |
|---|---|---|---|
| 6,303,986 B1 | 10/2001 | Shook | |
| 6,630,725 B1 | 10/2003 | Kuo et al. | |
| 6,808,954 B2 | 10/2004 | Ma et al. | |
| 6,809,412 B1 | 10/2004 | Tourino et al. | |
| 6,846,725 B2 | 1/2005 | Nagarajan et al. | |
| 7,368,808 B2 | 5/2008 | Heck et al. | |
| 7,456,497 B2 | 11/2008 | Higashi | |
| 8,008,739 B2 | 8/2011 | Ishii | |
| 8,148,790 B2* | 4/2012 | Morris et al. | 257/415 |
| 8,164,180 B2* | 4/2012 | Sato et al. | 257/704 |
| 8,283,737 B2* | 10/2012 | Sugizaki | 257/415 |
| 2005/0275075 A1* | 12/2005 | Hong et al. | 257/678 |
| 2008/0283943 A1 | 11/2008 | Dekker et al. | |
| 2009/0108381 A1 | 4/2009 | Buchwalter et al. | |
| 2010/0087024 A1 | 4/2010 | Hawat et al. | |
| 2010/0207217 A1 | 8/2010 | Zuniga-Ortiz et al. | |
| 2011/0241197 A1* | 10/2011 | Theuss | 257/693 |
| 2012/0015456 A1* | 1/2012 | Thompson et al. | 438/15 |
| 2012/0139068 A1* | 6/2012 | Stacey | 257/417 |

* cited by examiner

*Primary Examiner* — Allan R Wilson
(74) *Attorney, Agent, or Firm* — Edwards Wildman Palmer LLP; Peter F. Corless; Steven M. Jensen

(57) ABSTRACT

Proposed is a package structure having a micro-electromechanical (MEMS) element, including a chip having a plurality of electrical connecting pads and a MEMS element formed thereon; a lid disposed on the chip for covering the MEMS element; a stud bump disposed on each of the electrical connecting pads; an encapsulant formed on the chip with part of the stud bumps being exposed from the encapsulant; and a metal conductive layer formed on the encapsulant and connected to the stud bumps. The invention is characterized by completing the packaging process on the wafer directly to enable thinner and cheaper package structures to be fabricated within less time. This invention further provides a method for fabricating the package structure as described above.

8 Claims, 6 Drawing Sheets

US 8,564,115 B2

PACKAGE STRUCTURE HAVING MICRO-ELECTROMECHANICAL ELEMENT

CROSS-REFERENCE TO RELATED APPLICATIONS

This application is a divisional of application U.S. Ser. No. 12/769,041, filed on Apr. 28, 2010, issued as U.S. Pat. No. 8,198,689 on Jun. 12, 2012, which claims under 35 U.S.C. §119(a) the benefit of Taiwanese Application No. 098145250, filed Dec. 28, 2009, the entire contents of which are incorporated herein by reference.

FIELD OF THE INVENTION

The present invention relates to a package structure and fabrication methods thereof, and more particularly to a package structure having a micro-electromechanical (MEMS) element built therein and fabrication methods thereof.

BACKGROUND OF THE INVENTION

MEMS (Micro Electro Mechanical System) packages can contain many electrical and mechanical components in one device. Through various micro process techniques, a MEMS package is typically formed by disposing a micro-electromechanical element on a chip/die and then packaging the MEMS chip/die with a protection mask or an underfill to protect it from mechanical damage and hostile environments.

The package serves to integrate all of the components required for a system application in a manner that minimizes size, cost, mass and complexity. The three main functions of the MEMS package include: mechanical support, protection from the environment, and electrical connection to other system components. FIGS. 1A through 1D are cutaway views depicting several conventional package structures having micro-electromechanical, MEMS elements formed thereon.

The illustration of FIG. 1A is disclosed by U.S. Pat. No. 6,809,412, characterized in that a chip 14 having a micro-electromechanical element 141 formed thereon is disposed on a substrate 10, wherein the chip 14 is electrically connected to the substrate 10 by bonding wires 11, and finally a glass lid 12 is disposed on the substrate 10 to hermetically encapsulate the chip 14, the MEMS element 141 and bonding wires 11.

The illustration of FIG. 1B is disclosed by U.S. Pat. No. 6,303,986, characterized in that a glass lid 12 is disposed on a chip 14 having a MEMS element 141 formed thereon for hermitically encapsulating the MEMS element 141 therein for protection; the chip 14 is disposed on a leadframe 10' to be carried; the leadframe 10' is electrically connected to the chip 14 by bonding wires 11; and the bonding wires 11, the lid 12, and the chip 14 are hermetically encapsulated with a packaging material 15.

One common drawback of the above package structures share is that both require the use of a carrier (such as the substrate 10 in FIG. 1A and the leadframe 10' in FIG. 1B), thereby adversely and undesirably increasing the dimensions of the overall structure and thus failing to comply with the demand for device miniaturization. Consequently, the so-called carrier-free package structures have been developed to counter the profile issue.

As depicted in FIG. 1C, a carrier-free package structure is disclosed by U.S. Pat. No. 7,368,808 characterized in that a glass lid 12 formed with conductive apertures 120 is disposed on a chip 14 having electrical connecting pads 140 and a MEMS element 141 formed thereon for encapsulating the MEMS element 141 therein, wherein the conductive apertures 120 comprise contact pads 122 formed on both sides thereof, the contact pads 122 formed on the inner side being electrically connected to the electrical connecting pads 140 and those formed on the outer side having solder balls 16 formed thereon for allowing the chip 14 to electrically connect with other electronic components via solder balls 16.

In the MEMS package structure depicted in FIG. 1D and disclosed by U.S. Pat. No. 6,846,725, a glass lid 12 formed with conductive apertures 120 is disposed on a chip 14 having electrical connecting pads 140 and a MEMS element 141 formed thereon for hermetically encapsulating the MEMS element 141 therein, wherein the electrical connecting pads 140 further comprise solder bumps 142 and the conductive apertures 120 have contact pads 122 formed on both sides thereof, the contact pads 122 formed on the inner side of the conductive apertures 120 being electrically connected to solder bumps 142 such that the chip 14 can be electrically connected with other electronic components via the contact pads 122 formed on the outer side thereof.

While carrier-free packages are advantageous and favorable for device miniaturization, it nevertheless requires that conductive apertures 120 be fabricated in the lid 12 which then gives rise to issues of high-cost glass drilling and misalignment of the contact pads 122 formed on both sides of conductive apertures 120 or an insecure bonding therebetween, thereby adversely causing inferior electrical connection which in turn degrades the electrical performance of the chip 14 connecting with external electronic components consequently. Therefore, it is desirable to provide a novel package structure that improves on the drawbacks of the prior art as mentioned above.

SUMMARY OF THE INVENTION

In view of the foregoing drawbacks associated with the conventional technology, the present invention proposes a package structure having a MEMS element built therein, comprising a chip having a plurality of electrical connecting pads and a MEMS element formed thereon; a lid disposed on the chip for covering the MEMS element; a stud bump disposed on each of the electrical connecting pads; an encapsulant formed on the chip for hermetically encapsulating the stud bumps and the electrical connecting pads, wherein the encapsulant comprises a protruding portion encapsulating the lid, and part of the stud bumps is exposed from the encapsulant; and a metal conductive layer formed on the encapsulant and connected to the stud bumps, wherein the metal conductive layer comprises contact pads.

In one aspect, the encapsulant comprises a protruding portion flush with the top of the lid and part of the stud bumps is exposed from the encapsulant.

In the foregoing package structure having the MEMS element, the chip may be made of a silicon material; the MEMS element includes gyroscopes, accelerometers or radiation frequency micro-electromechanical (RF MEMS) elements; the lid may be made of glass or silicon materials; the stud bumps may be made of metallic materials consisting of Gold (Au), Copper (Cu), or a soldering material such as Tin; and the encapsulant may be made of thermal solid resins.

Additionally, the foregoing package structure having the MEMS element may further comprises a solder ball disposed on each of the contact pads.

In the foregoing package structure having the MEMS element, the protruding portion has a side wall tilting outwards, and preferably, the included angle of the protruding portion with respect to the side wall is from 45 to 90 degrees. Further, the stud bumps may be disposed at the periphery of the lid.

In the foregoing package structure having the MEMS element, the metal conductive layer is provided with a solder mask layer formed with solder mask openings for allowing each of the contact pads to be exposed therefrom, wherein each of the contact pads has a solder ball formed thereon. In one aspect, an under bump metallurgy (UBM) layer may further be formed between the solder balls and contact pads, and the under bump metallurgy (UBM) layer may be of a multi-layered structure composed of Gold, Nickel, Nickel/Gold, or Gold/Nickel/Gold.

In one aspect of the package structure having the MEMS element, the protruding portion may be formed with an encapsulant opening for allowing the MEMS element to be exposed from the lid, the metal conductive layer may be formed to extend to the lid in the encapsulant opening, and the contact pads are formed on the lid.

In one aspect of the package structure having a protruding portion flush with the top of the lid, the metal conductive layer may be formed to extend to the lid and the contact pads are formed on the lid.

The present invention further discloses a method for fabricating the package structure having the MEMS element as described above, comprising: providing a wafer whereon a plurality of electrical connecting pads and a plurality of MEMS elements are disposed; disposing a plurality of lids on the wafer each covering on a respective MEMS element; forming a stud bump on each of the electrical connecting pads; forming an encapsulant on the wafer for hermetically encapsulating the lids, the stud bumps and electrical connecting pads therein; cutting the encapsulant disposed at the periphery of the lids to form side walls and trenches between adjacent lids and reveal partial surfaces of the stud bumps therefrom; forming a metal conductive layer connected to the stud bumps on the encapsulant and comprising a plurality of contact pads; and performing a singulation process to form complete and individual package structures by cutting along the contour of the trenches.

In the foregoing method of fabricating the MEMS package structure, the encapsulant at the periphery of the lids is cut off by means of a bevel cut, and the trenches have a larger width on the tops than the bottoms thereof.

In one aspect, the method of fabricating the package structure having the MEMS element further comprises, prior to the singulation process, disposing a solder ball on each of the contact pads.

In the fabrication method of the package structure having the MEMS element, the wafer may be made of a silicon material; the MEMS element includes gyroscopes, accelerometers or radiation frequency, RF MEMS elements; the lids may be made of glass or silicon materials; the stud bumps may be made of a metallic material consisting of Gold (Au), Copper (Cu) or a soldering material such as Tin, wherein the stud bumps may be formed by means of wire-bonding or ball-planting; and the encapsulant may be made of thermal solid resins.

In the fabrication method of the package structure having the MEMS element, the included angle of the side wall with respect to the top of the encapsulant is preferably 45 to 90 degrees, and the bevel cut may be performed by means of angled cutting knifes or laser grooving.

In one aspect, the method of fabricating the package structure having the MEMS element further comprises forming a solder mask layer on the metal conductive layer with solder mask openings, for allowing each of the contact pads to expose from each solder mask opening, and further forming a solder ball on each of the contact pads. In addition, prior to formation of solder balls, an UBM (under bump metallurgy) layer may be formed on the contact pad between the solder balls and contact pads, and the UBM (under bump metallurgy) layer may be of a multi-layered structure comprised of Gold, Nickel, Nickel/Gold, or Gold/Nickel/Gold.

In one aspect of the fabrication method of the package structure having the MEMS element, the encapsulant formed above the MEMS element may further comprise an encapsulant opening for exposing the lid therefrom to reveal the MEMS element therefrom. Further, the metal conductive layer may be formed to extend to the lid in the encapsulant opening and the contact pads are formed on the lid.

In one aspect of the fabrication method of the package structure having the MEMS element, the encapsulant may be flush with the top of the lid, and the metal conductive layer may be formed to extend to the lid and the contact pads are formed on the lid.

Summarizing from the above, the package structure having the MEMS element of the present invention is characterized in that the packaging process is completed directly on the wafer without the use of any additional carriers which allows the overall package thickness/size to be minimized. Moreover, the present invention avoids the need to drill holes on the glass lid that helps to simplify the manufacturing process and thus reduces the costs, and also the invention employs the technique of wafer-level packaging that reduces the manufacturing steps to a minimum as well as the time required as a result.

BRIEF DESCRIPTION OF THE DRAWINGS

The present invention can be more fully understood by reading the following detailed description of the preferred embodiments, with reference made to the accompanying drawings, wherein:

FIGS. 2A through 2H are cutaway views illustrating a first embodiment of the package structure having the MEMS element according to the present invention, wherein FIG. 2F is a top view and FIG. 2F' is a cutaway view of FIG. 2F;

DETAILED DESCRIPTION OF THE PREFERRED EMBODIMENTS

The present invention is described in the following with specific embodiments, such that one skilled in the pertinent art can easily understand other advantages and effects of the present invention from the disclosure of the invention. The present invention may also be implemented and applied according to other embodiments, and the details may be modified based on different views and applications without departing from the spirit of the invention.

The following embodiments describe a package structure and a fabrication method thereof. The drawings are simplified to show the special features of the invention in an easily understandable format, and only the components directly related to the invention are shown, details for the remaining components being omitted for brevity.

First Preferred Embodiment

Figure 1A:
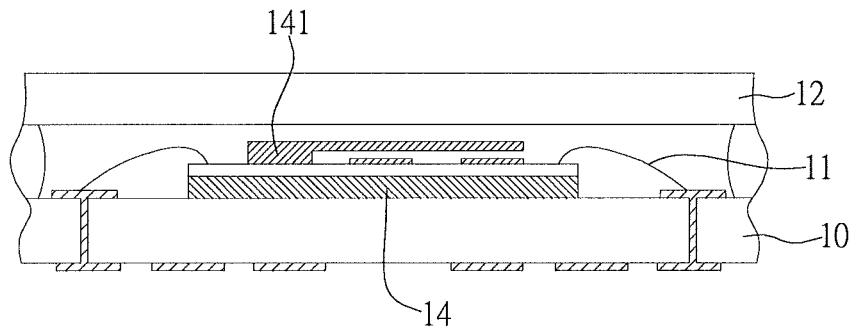
FIG. 1A through FIG. 1D are cutaway views illustrating different embodiments of conventional package structures having the MEMS elements.
Figure 1B:
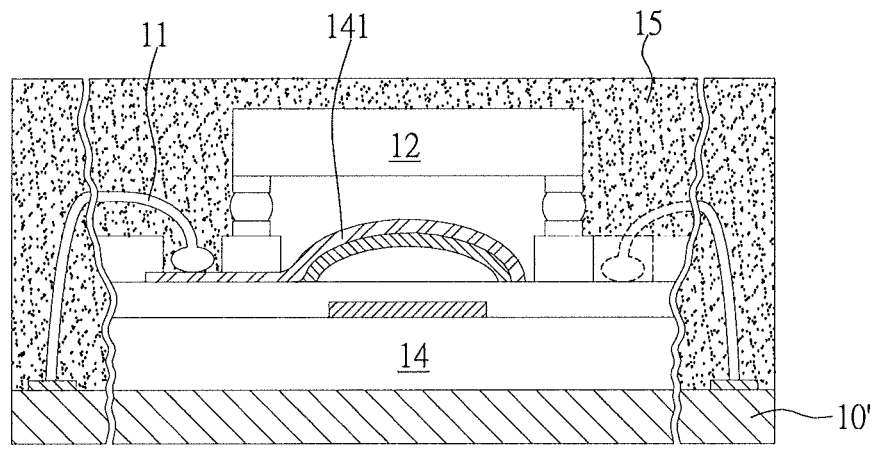
Figure 1C:
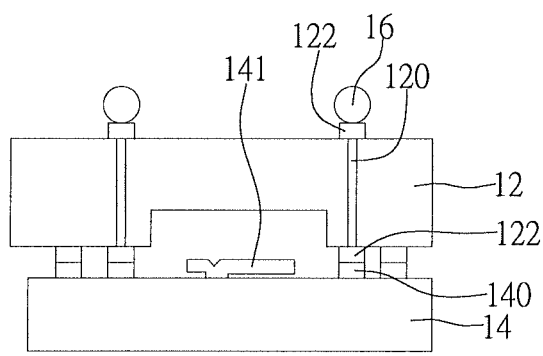
Figure 1D:
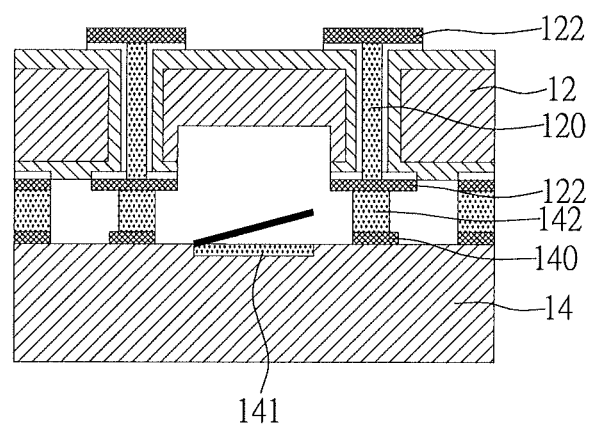
Figure 2A:
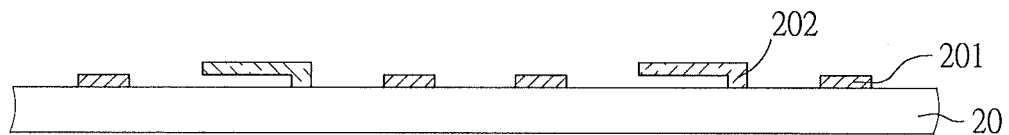
Figure 2B:
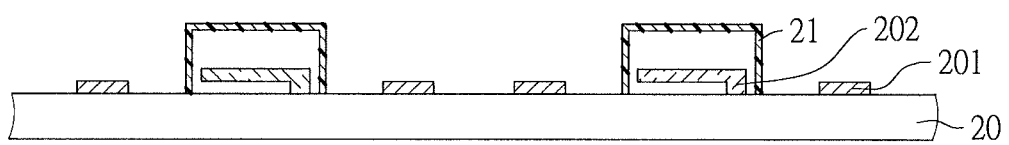
Figure 2C:
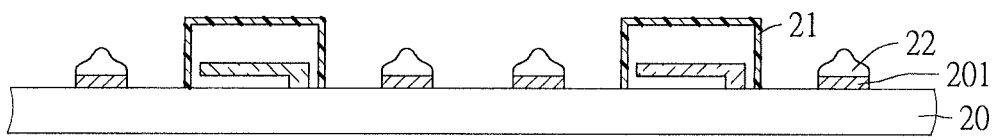
Figure 2D:
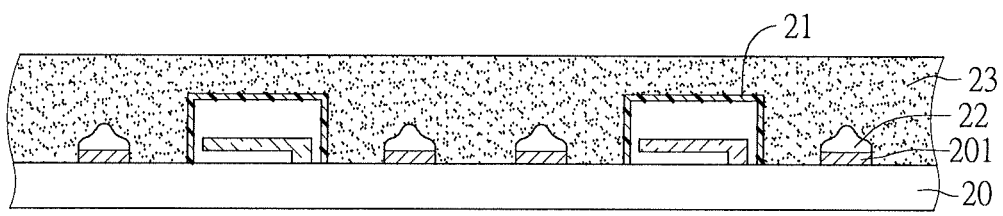
Figure 2E:
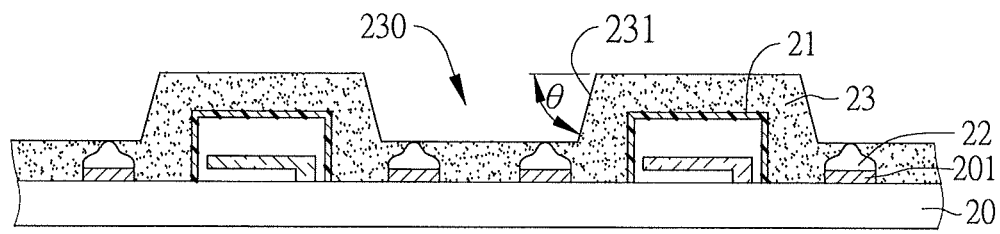
Figure 2F:
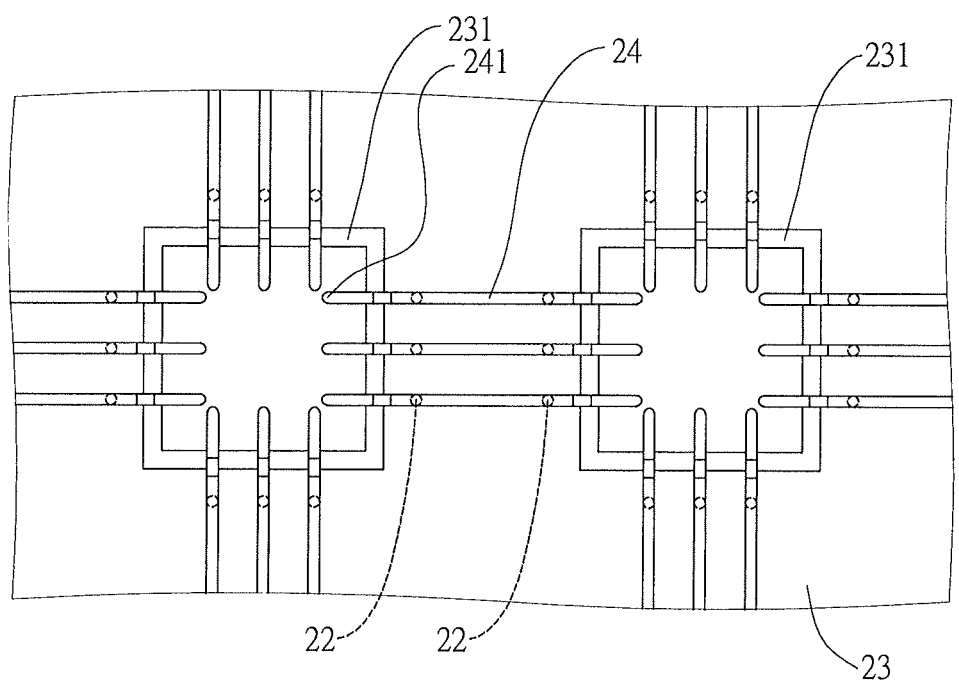
Figure 2F:
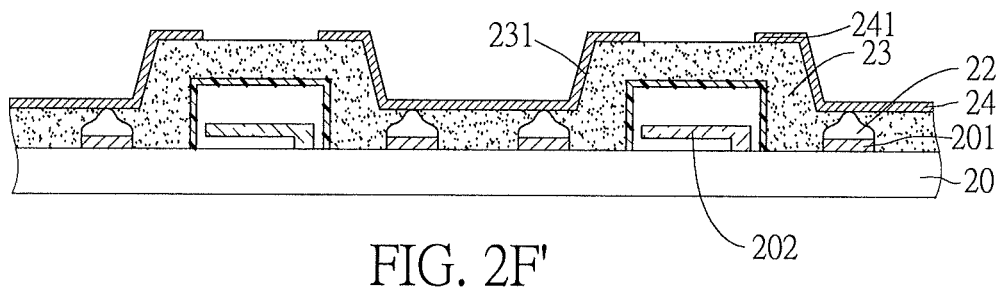

FIG. 2A through FIG. 2H are cutaway views illustrating a first embodiment of the package structure having the microelectromechanical (MEMS) element and a fabrication method thereof according to the present invention, wherein FIG. 2F is a top view and FIG. 2F' is a cutaway view of FIG. 2F;

As shown in FIG. 2A, a wafer 20 is provided whereon a plurality of electrical connecting pads 201 and a plurality of the MEMS elements 202 are formed, wherein the wafer 20 may be made of a silicon material, and the MEMS elements include gyroscopes, accelerometers or radiation frequency (RF MEMS) elements.

As illustrated in FIG. 2B, a plurality of lids 21 are disposed on the wafer 20 each covering on a MEMS element 202, wherein the lids 21 may be formed by glass or silicon materials.

As shown in FIG. 2C, a stud bump 22 is formed on each of the electrical connecting pads 201, wherein the stud bump 22 is made of a metallic material, and preferably, a soldering material such as Gold, Copper or Tin, and the stud bumps 22 may be formed by means of wire-bonding or ball-planting.

As shown in FIG. 2D, an encapsulant 23 is disposed on the wafer 20 for encapsulating the lids 21, the stud bumps 22 and electrical connecting pads 201, wherein the encapsulant 23 may be made of thermal solid resins of dielectric compound materials, such as Epoxy or Epoxy Molding Compound, EMC. In one aspect, the encapsulant 23 may be formed by covering a side surface of the lid 21 and is flush with the top of the lids 21.

As shown in FIG. 2E, the encapsulant 23 is cut by means of a bevel cut along the periphery of the lids 21 to form a trench 230 having a wider top than the bottom thereof between two adjacent lids 21 and side walls 231 as tilting sides thereof, and partial surfaces of the stud bumps 22 are exposed therefrom, wherein the included angle of the side walls 231 with respect to the top surface of the encapsulant 23 is preferably 45 to 90 degrees, and the bevel cut is performed by means of angled cutting knifes or laser grooving.

As illustrated in FIG. 2F and FIG. 2F', a metal conductive layer 24 electrically connected to the stud bumps 22 is formed on the encapsulant 23 with one end thereof extending towards the MEMS element 202 and further forming contact pads 241 at the terminal thereof.

Figure 2G:
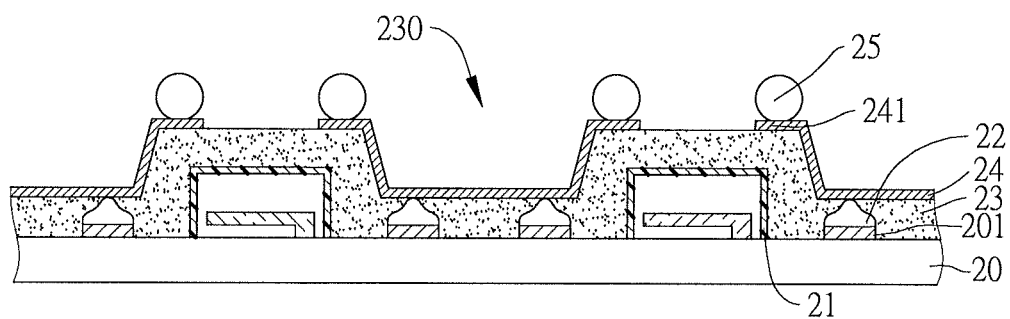

As illustrated in FIG. 2G, a solder ball 25 is disposed on each of the contact pads 241 prior to performing the sigulation process. In one aspect, prior to forming the solder balls 25 on the contact pads 241, a solder mask layer (not shown) formed with solder mask openings (not shown) may be disposed on the metal conductive layer 24 for allowing each of the contact pads 241 to be revealed from each solder mask opening. Further, an under bump metallurgy, UBM layer may be formed before solder balls are formed, wherein the UBM layer may be of a multi-layered structure consisting of Gold, Nickel, Nickel/Gold, or Gold/Nickel/Gold. In that the manufacture of the UBM layer is a prior technique well-known in the art, further depiction thereof are omitted herein for the sake of brevity.

Figure 2H:
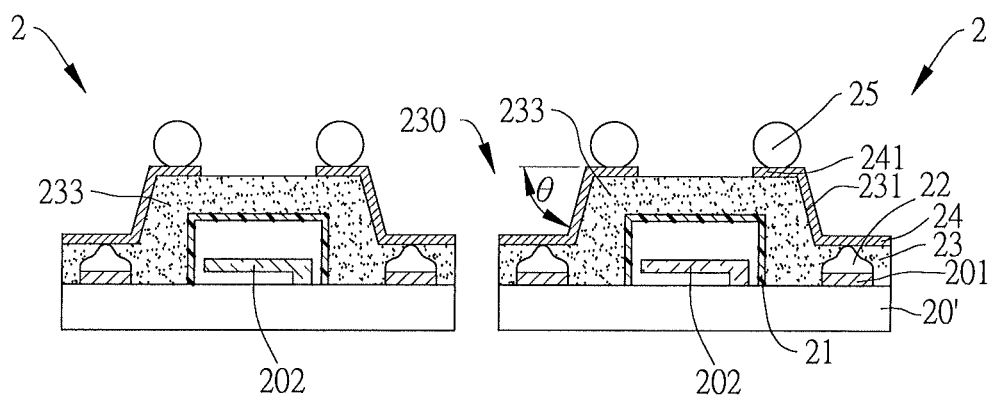

As shown in FIG. 2H, a singulation process is performed along the contour of each trench 230 to thereby form multiple complete package structures 2 each having a MEMS element 202 built therein.

By the foregoing fabrication method, the present invention also proposes a package structure having the MEMS element as described above, comprising a chip 20' having a plurality of electrical connecting pads 201 and a MEMS element 202 formed thereon; a lid 21 disposed on the chip 20' for covering the MEMS element 202; a stud bump 22 disposed on each of the electrical connecting pads 201; an encapsulant 23 disposed on the chip 20' and hermetically encapsulating the lid 21, the stud bumps 22 and electrical connecting pads 201, wherein parts of the stud bumps 22 are exposed from the encapsulant 23, the encapsulant 23 comprising a protruding portion 233 hermetically encapsulating the lid 21; and a metal conductive layer 24 disposed on the encapsulant 23 and connected to the stud bumps 22, wherein the metal conductive layer 24 extends from the end of stud bumps 22 toward the MEMS element 202, and a contact pad 241 is formed above the MEMS element 202 or the lid 21, wherein each of the contact pads 241 has a solder ball 25 disposed thereon.

In one aspect of the foregoing package structure having the MEMS element, the chip 20' may be made of a silicon material; the MEMS element 202 includes gyroscopes, accelerometers or radiation frequency (RF MEMS) elements; the lid 21 may be made of glass or silicon materials; the stud bumps 22 are preferably made of a metallic material consisting of Gold (Au), Copper (Cu), or a soldering material such as Tin; and the encapsulant 23 may be made of a dielectric material of thermal solid resins, such as Epoxy or Epoxy Molding Compound, EMC.

In one aspect of the foregoing package structure having the MEMS element, the included angle of side walls 231 of the protruding portion 233 with respect to the top thereof is preferably 45 to 90 degrees, and further the stud bumps may be disposed at the periphery of the lid 21.

In one aspect of the foregoing package structure having the MEMS element, a solder mask layer formed with solder mask openings (not illustrated) is formed on the metal conductive layer 24 for allowing each of the contact pads 241 to be exposed therefrom, wherein each of the contact pads 241 has a solder ball 25 formed thereon. In one aspect, an under bump metallurgy, UBM layer (not illustrated) may be formed between solder balls 25 and contact pads 241, and the under bump metallurgy, UBM layer may be of a multi-layered structure comprised of Gold, Nickel, Nickel/Gold, or Gold/Nickel/Gold.

Second Preferred Embodiment

Figure 3:
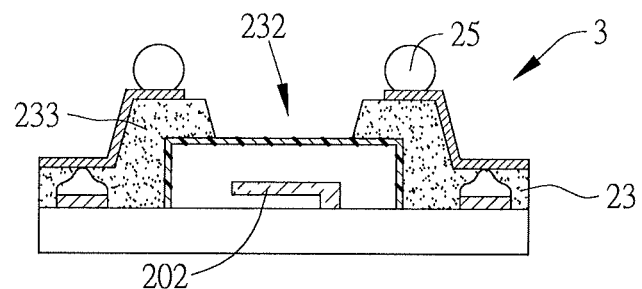
FIG. 3 is a cutaway view illustrating a second embodiment of the package structure having the MEMS element according to the present invention.

FIG. 3 is a cutaway view illustrating a second embodiment of the package structure having the MEMS element according to the present invention. In this embodiment, the package structure 3 is similar to the one depicted in FIG. 2H and only differs in that the protruding portion 233 of the encapsulant 23 formed on the MEMS element 202 is provided with an encapsulant opening 232 for allowing the MEMS element 202 to be exposed therefrom. The fabrication method of the package structure 3 is substantially identical to that of the first embodiment and the description thereof is omitted herein for brevity.

Third Preferred Embodiment

Figure 4:
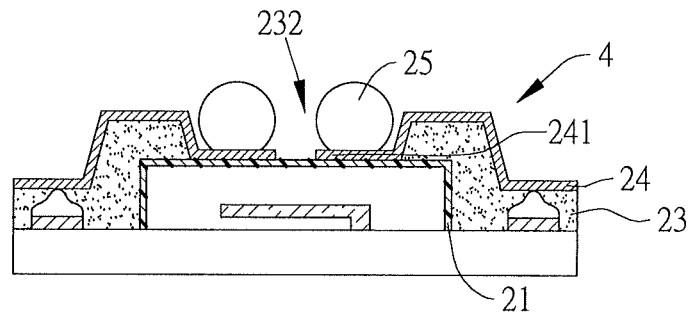
FIG. 4 is a cutaway view illustrating a third embodiment of the package structure having the MEMS element according to the present invention.

FIG. 4 is a cutaway view illustrating a third embodiment of the package structure having the MEMS element according to the present invention. In this embodiment, the package structure 4 is similar to the one depicted in FIG. 3 and only differs in that the metal conductive layer 24 is formed to extend to the lid 21 in the encapsulant opening 232, and the contact pads 241 are formed on the lid 21. The fabrication method of the package structure 4 is substantially identical to that of the first embodiment and the description thereof is omitted herein for brevity.

Fourth Preferred Embodiment

Figure 5:
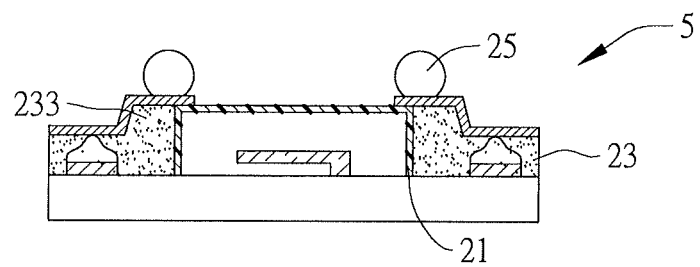
FIG. 5 is a cutaway view illustrating a fourth embodiment of the package structure having the MEMS element according to the present invention.

FIG. 5 is a cutaway view illustrating a fourth embodiment of the package structure having the MEMS element according to the present invention. In this embodiment, the package structure 5 is similar to the one depicted in FIG. 2H and only differs in that the top of the encapsulant 23 is flush with the top of the lid 21, meaning the protruding portion 233 is flush with the top of the lid 21. The fabrication method of the package structure 5 is substantially identical to that of the first embodiment, in which the encapsulant 23 as illustrated in FIG. 2D may be formed to have a larger height than that of the lid 21, or, the encapsulant 23 may be formed to cover a side surface of the lid 21 and be flush with the top of the lid 21 in the step of forming the encapsulant 23.

Fifth Preferred Embodiment

Figure 6:
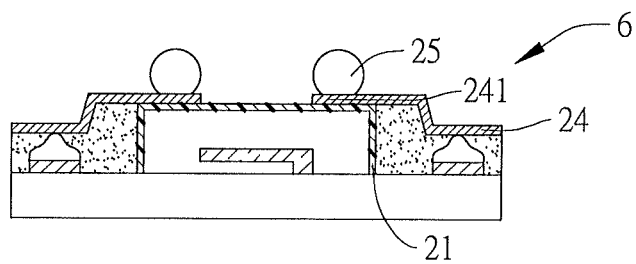
FIG. 6 is a cutaway view illustrating a fifth embodiment of the package structure having the MEMS element according to the present invention.

FIG. 6 is a cutaway view illustrating a fifth embodiment of the package structure having the MEMS element according to the present invention. In this embodiment, the package structure 6 is similar to the one depicted in FIG. 5 and only differs in that the metal conductive layer 24 is formed to extend to the lid 21 and the contact pads 241 are formed on the lid 21. The fabrication method of the package structure 6 is substantially identical to that of the first embodiment and the description thereof is omitted herein for brevity.

In conclusion, the package structure having the MEMS element of the present invention yields advantages over prior techniques in that the packaging process can be completed on the wafer directly without the use of any additional carrier member to have a desirable package profile. Moreover, the present invention avoids the need to drill holes on the glass lid that helps to simplify the manufacturing process and thus reduces the costs, and also the invention employs the technique of wafer-level packaging that reduces the manufacturing steps to a minimum as well as the time required.

What is claimed is:

1. A package structure having a micro-electromechanical (MEMS) element built therein, comprising:
    a chip having a plurality of electrical connecting pads and a MEMS element provided thereon;
    a lid disposed on the chip for covering the MEMS element;
    a stud bump disposed on each of the electrical connecting pads;
    an encapsulant formed on the chip for hermetically encapsulating the stud bumps and the electrical connecting pads, wherein the encapsulant comprises a protruding portion flush with the top of the lid, and part of the stud bumps is exposed from the encapsulant; and
    a metal conductive layer formed on the encapsulant and connected to the stud bumps, wherein the metal conductive layer comprises contact pads.

2. The package structure having a MEMS element as claimed in claim 1, further comprising a solder ball disposed on each of the contact pads.

3. The package structure having a MEMS element as claimed in claim 2, wherein a solder mask layer with solder mask openings is disposed on the metal conductive layer, for allowing the contact pads to be exposed from the solder mask openings, respectively, and a solder ball is disposed on each of the contact pads.

4. The package structure having a MEMS element as claimed in claim 2, wherein an UBM (under bump metallurgy) layer is disposed between the solder balls and contact pads.

5. The package structure having a MEMS element as claimed in claim 1, wherein the protruding portion comprises side walls tilting outward.

6. The package structure having a MEMS element as claimed in claim 5, wherein the included angle of the side wall and the top of the protruding portion is 45 to 90 degrees.

7. The package structure having a MEMS element as claimed in claim 5, wherein the bumps are provided at the outer periphery of the lid.

8. The package structure having a MEMS element as claimed in claim 1, wherein the metal conductive layer extends onto the lid, and the contact pads are provided on the lid.

* * * * *